(12) United States Patent
Ryu et al.

(10) Patent No.: US 9,748,517 B2
(45) Date of Patent: Aug. 29, 2017

(54) ORGANIC INSULATING MATERIAL AND FLEXIBLE DISPLAY INCLUDING THE SAME

(71) Applicant: LG Display Co., Ltd., Seoul (KR)

(72) Inventors: Kyungyeol Ryu, Incheon (KR); JinWuk Kim, Goyang-si (KR); Wy-Yong Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 40 days.

(21) Appl. No.: 14/755,525

(22) Filed: Jun. 30, 2015

(65) Prior Publication Data

US 2015/0376356 A1     Dec. 31, 2015

(30) Foreign Application Priority Data

Jun. 30, 2014 (KR) ........................ 10-2014-0081286

(51) Int. Cl.
*H01L 51/00* (2006.01)
*H01L 51/46* (2006.01)
*H01L 51/52* (2006.01)

(52) U.S. Cl.
CPC .. *H01L 51/5253* (2013.01); *H01L 2251/5338* (2013.01)

(58) Field of Classification Search
CPC ............. H01L 27/3246; H01L 27/3258; H01L 51/0043; H01L 51/004; H01L 51/0035; H01L 51/5253; Y10T 428/10
See application file for complete search history.

(56) References Cited

U.S. PATENT DOCUMENTS

| | | | | |
|---|---|---|---|---|
| 2005/0279995 A1* | 12/2005 | Shin | ........................ | C08L 63/00 257/40 |
| 2006/0006380 A1 | 1/2006 | Shin et al. | | |
| 2006/0012901 A1* | 1/2006 | Shigemura | .......... | H01L 51/5262 359/883 |
| 2006/0258070 A1* | 11/2006 | Han | ...................... | H01L 51/055 438/167 |
| 2007/0187680 A1* | 8/2007 | Lee | ........................ | H01L 27/12 257/59 |

FOREIGN PATENT DOCUMENTS

| | | |
|---|---|---|
| CN | 1750290 A | 3/2006 |
| CN | 1787226 A | 6/2006 |
| CN | 101423737 A | 5/2009 |
| CN | 101659719 A | 3/2010 |
| CN | 101866071 A | 10/2010 |
| CN | 102736411 A | 10/2012 |
| CN | 103365007 A | 10/2013 |
| CN | 103524687 A | 1/2014 |
| CN | 104004138 A | 8/2014 |
| KR | 10-2015-0037125 A | 4/2015 |
| WO | WO 2009/115671 A1 | 9/2009 |
| WO | WO 2014/133154 A1 | 9/2014 |

OTHER PUBLICATIONS

Bian, Q. et al., "Self-Assembly of Photosensitive Amphiphilic Random Copolymer," Petrochemical Technology, Nov. 2008, pp. 1187-1194, vol. 37, No. 11. [with English abstract].
Cao, Z. et al., "Progress in Studies of Self-Healing Polymeric Materials: II. Self-Healing Mechanisms of Thermoplastic Polymer" Guangzhou Chemistry, Jun. 2011, pp. 67-71, vol. 36, No. 2. [with English abstract].
Chinese First Office Action, Chinese Application No. 201510374231.3, Aug. 30, 2016, 21 pages.
Chinese Second Office Action, Chinese Application No. 201510374231.3, Apr. 12, 2017, 23 pages.

* cited by examiner

*Primary Examiner* — Karuna P Reddy
(74) *Attorney, Agent, or Firm* — Fenwick & West LLP (57) ABSTRACT

An organic insulating material and a flexible display device are disclosed. The organic insulating material comprises an acrylic polymer having a cinnamoyl moiety.

5 Claims, 11 Drawing Sheets

| Optical magnification | Amount of light exposure ||
|---|---|---|
| | 50mJ/cm² | 100mJ/cm² |
| 200 times |  |  |
| 500 times |  |  |

FIG. 3B

| Optical magnification | Amount of light exposure ||
|---|---|---|
| | 50mJ/cm² | 100mJ/cm² |
| 200 times |  |  |
| 500 times |  |  |

ORGANIC INSULATING MATERIAL AND FLEXIBLE DISPLAY INCLUDING THE SAME

This application claims the priority benefit of Korean Patent Application No. 10-2014-0081286 filed on Jun. 30, 2014, which is incorporated herein by reference for all purposes as if fully set forth herein.

BACKGROUND OF THE INVENTION

Field of the Invention

The present invention relates to an organic insulating material and a flexible display device including the same and, more particularly, to a flexible display device in which an organic insulating film including a new organic insulating material having a self-healing ability has been formed.

Discussion of the Related Art

A variety of display devices capable of reducing weight and volume, that is, disadvantages of a cathode ray tube (CRT), are recently being developed. Such display devices may include, for example, a liquid crystal display (LCD), a field emission display (FED), a plasma display panel (PDP), and an organic light emitting display device (OLED). Furthermore, there is emerging a flexible display device that is fabricated to maintain display performance without a change although it is bent like paper using a flexible material, such as plastic, instead of an existing glass substrate not having flexibility.

The flexible display device is formed of a plurality of thin film transistor elements and organic insulating films. The organic insulating film includes a photosensitive resin composition formed of components, such as photo acryl (PAC), a binder, and a solvent. Acrylic resin has been commonly used as the binder. Conventional photosensitive resin has a problem that it is difficult to achieve high transmittance for an insulating layer because the photosensitive resin is colorized after hardening. Also the conventional photosensitive resin has a problem that volume is reduced after hardening. In order to suppress such colorization or volume reduction, a method of using a monomer not including a phenyl functional group or a method of increasing the glass transition temperature Tg of the organic insulating film is used. The methods are problematic in that the lifespan of a display device is reduced because a crack is generated in the organic insulating film if bending is generated in the completed display device and the generated crack is further grown over time.

SUMMARY OF THE INVENTION

An embodiment of the present invention provides a new organic insulating material capable of healing a crack generated in an organic insulating film and improving the lifespan of a device by forming the organic insulating film including the new organic insulating material and a flexible display device including the same.

In one aspect, there is an organic insulating material comprising an acrylic polymer having cinnamoyl moiety.

In other aspect, there is a flexible display device, comprising, a substrate, a thin film transistor on the substrate, an organic insulating film on the thin film transistor, and a pixel electrode on the organic insulating film, wherein the organic insulating film comprises an organic insulating material including an acrylic polymer having cinnamoyl moiety.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE EMBODIMENTS

Hereinafter, embodiments of the present invention are described in detail with reference to the accompanying drawings.

Figure 1:
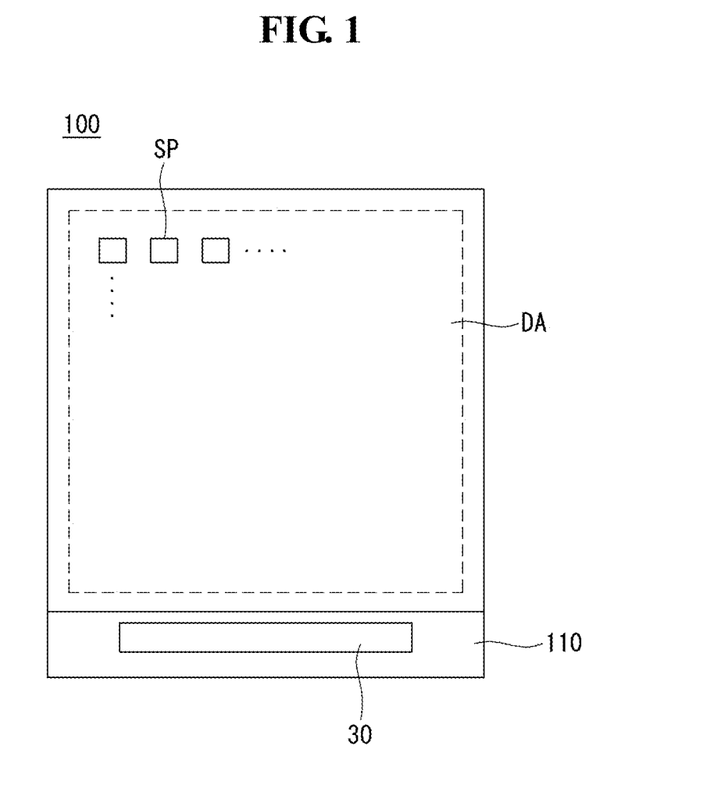
FIG. 1 is a plan view of a flexible display device in accordance with an embodiment of the present invention.
Figure 2:
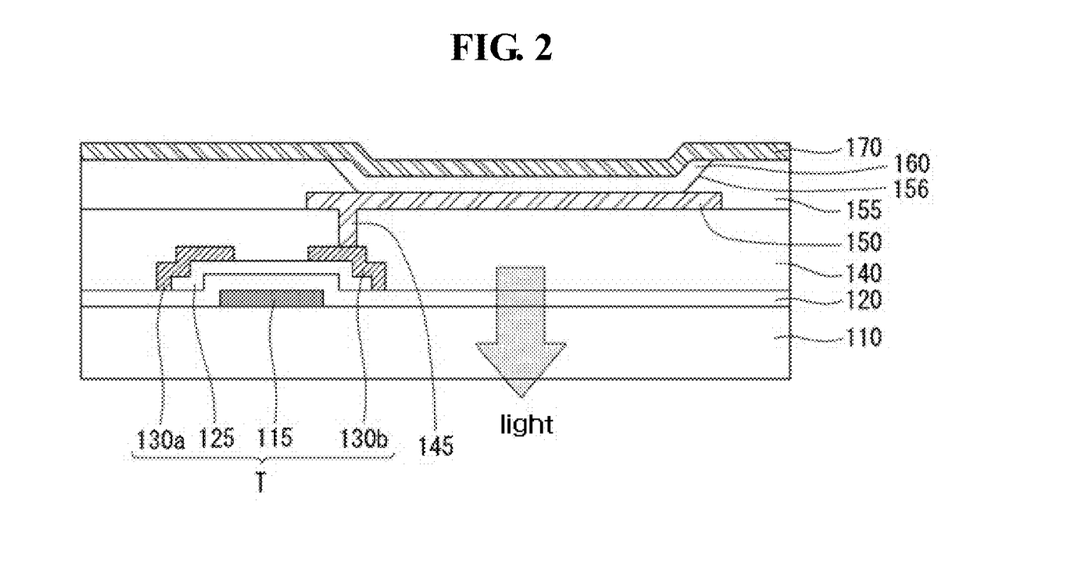
FIG. 2 is a cross-sectional view illustrating a subpixel of the flexible display device in accordance with an embodiment of the present invention.

FIG. 1 is a plan view of a flexible display device in accordance with an embodiment of the present invention, and FIG. 2 is a cross-sectional view illustrating a subpixel of the flexible display device in accordance with an embodiment of the present invention. An organic light emitting display is described below as an example of the flexible display device in accordance with an embodiment of the present invention, but the present invention is not limited thereto. The present invention may be applied to all flexible display devices, such as a liquid crystal display and an electrophoresis display device.

Referring to FIG. 1, the flexible display device 100 in accordance with an embodiment of the present invention includes a display unit DA configured to have a plurality of subpixels SP formed therein and to display an image is placed on a substrate 110. A driving unit 30 for applying a driving signal to the plurality of subpixels SP placed within the display unit DA is placed on the substrate 110. The flexible display device 100 in accordance with an embodiment of the present invention includes the plurality of subpixels SP, but only a single subpixel SP is described below, for convenience of description.

Referring to FIG. 2, the flexible display device 100 in accordance with an embodiment of the present invention includes a gate electrode 115 placed on the substrate 110.

The gate electrode 115 may be made of any one selected from a group consisting of molybdenum (Mo), aluminum (Al), chrome (Cr), gold (Au), titanium (Ti), nickel (Ni), and copper (Cu) or of an alloy of them, and may have a single layer or a multiple layer. A gate insulating layer 120 for insulating the gate electrode 115 is formed on the gate electrode 115. The gate insulating layer 120 may be formed of a silicon oxide layer (SiOx) or a silicon nitride layer (SiNx) or a double layer of them. Both the substrate 110 and gate insulating layer 120 may be made of materials that transmit light within a range of wavelengths including 280 nm, and generally also including a range of visible wavelengths which the display device 100 is configured to emit during operation.

A semiconductor layer 125 is placed on the gate insulating layer 120 corresponding to the gate electrode 115. The semiconductor layer 125 may be made of amorphous silicon or may be made of polysilicon crystallized from amorphous silicon. In some embodiments, the semiconductor layer 125 may be made of any one of zinc oxide (ZnO), indium zinc oxide (InZnO), indium gallium zinc oxide (InGaZnO), and zinc tin oxide (ZnSnO). Furthermore, the semiconductor layer 125 may be made of a low polymer-series or polymer-series organic matter, such as mellocyanine, phthalocyanine, pentacene, or thiophen polymer.

A source electrode 130a and drain electrode 130b electrically connected to the semiconductor layer 125 are placed on the semiconductor layer 125. The source electrode 130a and the drain electrode 130b may be made of any one selected from a group consisting of molybdenum (Mo), aluminum (Al), chrome (Cr), gold (Au), titanium (Ti), nickel (Ni), and copper (Cu) or an alloy of them. Furthermore, each of the source electrode 130a and the drain electrode 130b may have a double layer. The double layer may be a layer made of molybdenum (Mo)/aluminum-neodymium (Al—Nd), molybdenum (Mo)/aluminum (Al), or titanium (Ti)/aluminum (Al). Furthermore, each of the source electrode 130a and the drain electrode 130b may have a multiple layer. The multiple layer may be a layer made of molybdenum (Mo)/aluminum-neodymium (Al—Nd)/molybdenum (Mo), or titanium (Ti)/aluminum (Al)/titanium (Ti).

Furthermore, an organic insulating film 140 is placed on a thin film transistor T, including the gate electrode 115, the semiconductor layer 125, the source electrode 130a, and the drain electrode 130b. The organic insulating film 140 may be a planarized film that functions to reduce the steps of an underlying structure and also protect the underlying structure. The organic insulating film 140 includes an organic insulating material as a positive type or negative type photosensitive organic insulating film.

The organic insulating material included in the organic insulating film 140 in accordance with an embodiment of the present invention comprises an acrylic polymer having cinnamoyl moiety. The organic insulating material is described in more detail later.

A via hole 145 for exposing part of the source electrode 130a or the drain electrode 130b is placed in the organic insulating film 140. A pixel electrode 150 electrically connected to the source electrode 130a or the drain electrode 130b is placed on the organic insulating film 140. The pixel electrode 150 may be made of a transparent conductive layer that can transmit light, such as indium tin oxide (ITO), indium zinc oxide (IZO), indium tin zinc oxide (ITZO), zinc oxide (ZnO), indium gallium zinc oxide (IGZO), or graphene. A bank layer 155 including an opening 156 that exposes the pixel electrode 150 is placed on the pixel electrode 150. The bank layer 155 may be a pixel definition layer that reduces the steps of an underlying structure and defines a light-emitting region. The bank layer 155 may be made of the same material as the organic insulating film 140, but is not limited thereto.

A light-emitting layer 160 is placed on the pixel electrode 150. The light-emitting layer 160 is made of an organic matter that emits white light, and thus can emit white light. The light-emitting layer 160 is formed on the pixel electrode 150 in all the subpixels. Accordingly, white light emitted by the light-emitting layer 160 passes through the color filter, thus being capable of implementing red, green, and blue lights. Furthermore, one or more of an electron injection layer (EIL) and an electron transportation layer (ETL) may be further included between the light-emitting layer 160 and the pixel electrode 150 in order to facilitate movement of electrons toward the light-emitting layer 160. Furthermore, one or more of a hole injection layer (HIL) and a hole transportation layer (HTL) may be further included between the light-emitting layer 160 and the counter electrode 170 in order to facilitate movement of holes toward the light-emitting layer 160.

A counter electrode 170 is placed over the substrate 110 including the light-emitting layer 160. The counter electrode 170 may be made of metal having a low working function, such as aluminum (Al), silver (Ag), magnesium (Mg) or calcium (Ca) or an alloy of them. Furthermore, the counter electrode 170 may have a thickness of 500 to 2000 Å so that light can be emitted by the light-emitting layer 160. As described above, the flexible display device 100 in accordance with an embodiment of the present invention may have a rear light-emitting structure in which light emitted by the light-emitting layer 160 is emitted toward the substrate 110 in which the underlying pixel electrode 150 is placed. Furthermore, the flexible display device in an embodiment of the present invention has been illustrated as having the structure of the bottom gate type thin film transistor in which the gate electrode is disposed under the semiconductor layer, but may have the structure of a top gate type thin film transistor in which the gate electrode is disposed over the semiconductor layer.

An organic insulating material in accordance with an embodiment of the present invention and an organic insulating film including the same are described in detail below. The organic insulating material in accordance with an embodiment of the present invention comprises an acrylic polymer having cinnamoyl moiety. The acrylic polymer comprises monomer having cinnamoyl moiety and two or more of acrylic monomers selected from selected from BAA (Benzyl acrylic acid), MMA (Methyl methacrylate), and GMA (Glycidyl methacrylate). The monomer having cinnamoyl moiety is represented by Chemical Formula 1 below.

Cinnamoyloxy Ethyl Methacrylate (CEMA)

(1)

In one embodiment, the acrylic polymer having cinnamoyl moiety is represented by chemical formula 2 below.

(2)

In the example of Chemical Formula 2, $R_1$ is benzyl acrylic acid (BAA), $R_2$ is methyl methacrylate (MMA), $R_3$ is glycidyl methacrylate (GMA), and a, b, c, and d satisfy $a+b+c+d=1$, $0.2 \leq a \leq 0.25$, $0.1 \leq b \leq 0.15$, $0.2 \leq c \leq 0.25$, and $0.35 \leq d \leq 0.4$. In Chemical Formula 2, all of the monomers are bonded to a back bone.

In Chemical Formula 2, BAA (Benzyl acrylic acid) corresponding to $R_1$ assigns alkali solubility to an organic insulating film made of the organic insulating material. MMA (Methyl methacrylate) corresponding to $R_2$ assigns an adhesive force with the substrate, and is for a crosslink bond. GMA (Glycidyl methacrylate) corresponding to $R_3$ assigns mechanical strength and hardness.

Benzyl acrylic acid

Glycidyl methacrylate    Methyl methacrylate

The acrylic monomer is included in an amount of 1 to 30 parts by weight based on 100 parts by weight of the organic insulating material.

The solvent may be one or more selected from a group consisting of methyl ethyl ketone, cyclohlexanone, methyl isobutyl ketone, methyl cellosolve, ethyl cellosolve, tetrahydrofuran, dimethyl ether, propylene glycoldimethyl ether, propylene glycoldiethyl ether, propylene glycol monomethyl ether acetate (PGMEA), chloroform, methyletheracetate, ethyl-3-ethoxypropionate, ethyl cellosolveacetate, and butylacetate. The solvent is included in an amount of 65 to 75 parts by weight based on 100 parts by weight of the organic insulating material.

The photoinitiator may influence the adhesive force, visibility, and hardness of the organic insulating film made of the organic insulating material. For example, the photoinitiator may include one or more types selected from acetophenone-series compound benzophenone, such as 2,2'-diethoxyacetophenone, 2,2'-dibutoxiacetophenone, 2-hydroxy-2-methyl propiophenone, p-t-tyltrichloroacetophenone, p-t-butyldichloroacetophenone, benzophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropane-1-one, and 2-benzyl-2-dimethylamino-1-(4-morpholinophenyl)-butane-1-one, benzophenone-series compound thioxanthone, such as benzoyl benzoic acid, benzoyl benzoic acid methyl, 4-phenylbenzophenone, hydroxy benzophenone, acrylated benzophenone, 4,4'-bis(dimethyl amino)benzophenone, and 4,4'-bis(diethyl amino) benzophenone, thioxanthone-series compound benzoin, such as 2-chlorothioxanthone, 2-methylthioxanthone, isopropyl thioxanthone, 2,4-diethyl thioxanthone, 2,4-diisopropyl thioxanthone, and 2-chloro thioxanthone, benzoin-series compound 2,4,6,-trichloro s-triazine, such as benzoin methyl ether, benzoin ethyl ether, benzoin isopropyl ether, benzoinisobutyl ether, and benzyldimethylketal, and a triazine-series compound, such as 2-phenyl 4,6-bis(trichloro methyl)-s-tria, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-trill)-4,6-bis(trichloro methyl)-s-triazine, 2-phenyl 4,6-bis(trichloro methyl)-s-triazine, bis(trichloro methyl)-6-styryl s-triazine, 2-(naphtho 1-one)-4,6-bis(trichloromethyl)-s-triazine, 2-(4-methoxy naphtho 1-one)-4,6-bis(trichloro methyl)-s-triazine, 2-4-trichloro methyl (piperonyl)-6-triazine, and 2-4-trichloro methyl(4'-methoxy styryl)-6-triazine. The photoinitiator is included in an amount of 0.1 to 5 parts by weight based on 100 parts by weight of the organic insulating material.

The monomer having cinnamoyl moiety is a substance that heals a crack when the crack is generated in a hardened organic insulating film. The healing mechanism of the monomer having cinnamoyl moiety is described below. As indicated in the following reaction formula, when a crack is generated in the organic insulating film, a cyclobutane structure in which cinnamoyl functional groups are bonded is broken. Furthermore, when light having a wavelength equal to or more than 280 nm is radiated to the organic insulating film, the double bonds (C═C) of the cinnamoyl functional groups form the cyclobutane structure again, and are recombined, thereby healing the crack of the organic insulating film.

The monomer having cinnamoyl moiety is included in an amount of less than 40 parts by weight, preferably 35 to 40 parts by weight, based on 100 parts by weight of the total monomers.

As described above, the organic insulating material in accordance with an embodiment of the present invention includes the acrylic monomer, the solvent, the photoinitiator, and monomer having cinnamoyl moiety. Molecular weight Mw of the organic insulating material configured as described above may be 7,000 to 10,000.

Some experimental examples are disclosed hereinafter in order to help understanding of the present invention. The following experimental examples illustrate only embodiments of the present invention, and the present invention is not limited to the experiment examples below.

Experiment 1: Synthesis of Monomer Having Cinnamoyl Moiety and Fabrication of Organic Insulating Material Including the Cinnamoyl Moiety Synthesis of Monomer having Cinnamoyl Moiety (CEMA)

Hydroxyethylmethacrylate (HEMA) of 66 mmol, triethanolamine (TEA) of 66 mmol, and tetrahydrofuran (THF) of 100 ml were mixed and refluxed for 2 hours in order to remove moisture and air. The solution was cooled using an ice container of 0° C. Cinnamoyl chloride of 79 mmol was added to the solution and violently stirred for 2 hours at 0° C. Next, the solution was stirred for 4 hours at room temperature. Triethylamine hydrochloride salt was filtered and removed from the solution. The solution was concentrated by a rotary evaporator. The solution was poured in n-hexane 500 ml and purified using THF. Precipitates were removed from the solution, and the solvent was removed while the polymerization of the solvent was suppressed using cuprous chloride, thereby completing the reaction.

Fabrication of Organic Insulating Material

A mixed solution of benzyl acrylic acid (BAA), methyl methacrylate (MMA), and glycidyl methacrylate (GMA) as the acrylic monomer, CEMA as the monomer having cinnamoyl moiety, and a polymerization initiator is prepared. Propylene glycol monomethyl ether acetate (PGMEA) (105±5 degree), that is, the solvent, was prepared. $N_2$ purging was performed in a synthetic atmosphere. The mixed solution was dropped to the solvent for 2 hours. The remaining monomer was removed for 6 hours using a free radical scavenger of 0.1%. The organic insulating material was fabricated by controlling the remaining propylene glycol monomethyl ether acetate (PGMEA) to a solid 30%.

Experiment 2: Photo Characteristics of Organic Insulating Film Composition and Proof of Self-healing Fabrication of Organic Insulating Film Composition <Embodiment 1>

After an organic insulating material was fabricated by mixing 4.28 parts by weight of benzyl acrylic acid (BAA), 2.64 parts by weight of methyl methacrylate (MMA), 3.75 parts by weight of glycidyl methacrylate (GMA), 19.32 parts by weight of CEMA, 0.5 parts by weight of a photoinitiator ((1-hydroxycyclohexyl)phenylmethanone), and 69.51 parts by weight of propylene glycol monomethyl ether acetate (PGMEA), an organic insulating film composition was fabricated by mixing the photoinitiator and the solvent.

<Embodiment 2>

After an organic insulating material including benzyl acrylic acid (BAA) 6.31 parts by weight, 1.95 parts by weight of methyl methacrylate (MMA), 2.76 parts by weight of glycidyl methacrylate (GMA), 18.98 parts by weight of CEMA, 0.5 parts by weight of a photoinitiator ((1-hydroxycyclohexyl)phenylmethanone), and 69.5 parts by weight of propylene glycol monomethyl ether acetate (PGMEA) was fabricated, an organic insulating film composition was fabricated.

<Embodiment 3>

After an organic insulating material including 6.31 parts by weight of benzyl acrylic acid (BAA), 2.76 parts by weight of methyl methacrylate (MMA), 1.95 parts by weight of glycidyl methacrylate (GMA), 18.98 parts by weight of CEMA, 0.5 parts by weight of a photoinitiator ((1-hydroxycyclohexyl)phenylmethanone), and 69.5 parts by weight of propylene glycol monomethyl ether acetate (PGMEA) was fabricated, an organic insulating film composition was fabricated.

<Embodiment 4>

After an organic insulating material including benzyl acrylic acid (BAA) 4.28 parts by weight, 2.64 parts by weight of methyl methacrylate (MMA), 3.75 parts by weight of glycidyl methacrylate (GMA), 19.32 parts by weight of CEMA, 1 parts by weight of a photoinitiator ((1-hydroxycyclohexyl)phenylmethanone), and 69.01 parts by weight of propylene glycol monomethyl ether acetate (PGMEA) was fabricated, an organic insulating film composition was fabricated.

<Embodiment 5>

After an organic insulating material including 6.31 parts by weight of benzyl acrylic acid (BAA), 1.95 parts by weight of methyl methacrylate (MMA), 2.76 parts by weight of glycidyl methacrylate (GMA), 18.98 parts by weight of CEMA, 1 parts by weight of a photoinitiator ((l-hydroxycyclohexyl)phenylmethanone), and 69 parts by weight of propylene glycol monomethyl ether acetate (PGMEA) was fabricated, an organic insulating film composition was fabricated.

<Embodiment 6>

An organic insulating film composition, including 6.31 parts by weight of benzyl acrylic acid (BAA), 2.76 parts by weight of methyl methacrylate (MMA), 1.95 parts by weight of glycidyl methacrylate (GMA), 18.98 parts by weight of CEMA, 1 parts by weight of a photoinitiator ((1-hydroxycyclohexyl)phenylmethanone), and 69 parts by weight of propylene glycol monomethyl ether acetate (PGMEA), was fabricated.

<Embodiment 7>

An organic insulating film composition, including 7.49 parts by weight of benzyl acrylic acid (BAA), 4.63 parts by weight of methyl methacrylate (MMA), 6.57 parts by weight of glycidyl methacrylate (GMA), 11.3 parts by weight of CEMA, 0.5 parts by weight of a photoinitiator, and 69.51 parts by weight of propylene glycol monomethyl ether acetate (PGMEA), was fabricated.

<Embodiment 8>

After an organic insulating material including 10.49 parts by weight of benzyl acrylic acid (BAA), parts by weight of methyl methacrylate (MMA) 2.63, 5.57 parts by weight of glycidyl methacrylate (GMA), 11.3 parts by weight of CEMA, 0.5 parts by weight of a photoinitiator ((1-hydroxycyclohexyl)phenylmethanone), and 69.51 parts by weight of propylene glycol monomethyl ether acetate (PGMEA) was fabricated, an organic insulating film composition was fabricated.

<Embodiment 9>

After an organic insulating material including 10.49 parts by weight of benzyl acrylic acid (BAA), 5.57 parts by weight of methyl methacrylate (MMA), 2.63 parts by weight of glycidyl methacrylate (GMA), 11.3 parts by weight of CEMA, 0.5 parts by weight of a photoinitiator ((1-hydroxycyclohexyl)phenylmethanone), and 69.51 parts by weight of propylene glycol monomethyl ether acetate (PGMEA) was fabricated, an organic insulating film composition was fabricated.

<Embodiment 10>

After an organic insulating material including 7.49 parts by weight of benzyl acrylic acid (BAA), 4.63 parts by weight of methyl methacrylate (MMA), 6.57 parts by weight of glycidyl methacrylate (GMA), 11.3 parts by weight of CEMA, 1 parts by weight of the photoinitiator (((1-hydroxycyclohexyl)phenylmethanone), 69.51 parts by weight of propylene glycol monomethyl ether acetate (PGMEA) was fabricated, an organic insulating film composition was fabricated.

<Embodiment 11>

After an organic insulating material was including 10.49 parts by weight of benzyl acrylic acid (BAA), 2.63 parts by weight of methyl methacrylate (MMA), 5.57 parts by weight of glycidyl methacrylate (GMA), 11.3 parts by weight of CEMA, 1 parts by weight of a photoinitiator ((1-hydroxycyclohexyl)phenylmethanone), and 69.51 parts by weight of propylene glycol monomethyl ether acetate (PGMEA) fabricated, an organic insulating film composition was fabricated.

<Embodiment 12>

After an organic insulating material including 10.49 parts by weight of benzyl acrylic acid (BAA), 5.57 parts by weight of methyl methacrylate (MMA), 2.63 parts by weight of glycidyl methacrylate (GMA), 11.3 parts by weight of CEMA, 1 parts by weight of a photoinitiator ((1-hydroxycyclohexyl)phenylmethanone), and 69.51 parts by weight of propylene glycol monomethyl ether acetate (PGMEA) was fabricated, an organic insulating film composition was fabricated.

The content of each of the components in the embodiments 1 to 12 is list in Table 1.

TABLE 1

|  | #1 | #2 | #3 | #4 | #5 | #6 | #7 | #8 | #9 | #10 | #11 | #12 |
| --- | --- | --- | --- | --- | --- | --- | --- | --- | --- | --- | --- | --- |
| BAA | 4.28 | 6.31 | 6.31 | 4.28 | 6.31 | 6.31 | 7.49 | 10.49 | 10.49 | 7.49 | 10.49 | 10.49 |
| MMA | 2.64 | 1.95 | 2.76 | 2.64 | 1.95 | 2.76 | 4.63 | 2.63 | 5.57 | 4.63 | 2.63 | 5.57 |
| GMA | 3.75 | 2.76 | 1.95 | 3.75 | 2.76 | 1.95 | 6.57 | 5.57 | 2.63 | 6.57 | 5.57 | 2.63 |
| CEMA | 19.32 | 18.98 | 18.98 | 19.32 | 18.98 | 18.98 | 11.3 | 11.3 | 11.3 | 11.3 | 11.3 | 11.3 |
| Photo-initiator | 0.5 | 0.5 | 0.5 | 1.0 | 1.0 | 1.0 | 0.5 | 0.5 | 0.5 | 1.0 | 1.0 | 1.0 |
| PGMEA | 69.51 | 69.5 | 69.5 | 69.01 | 69.0 | 69.0 | 69.51 | 69.51 | 69.51 | 69.51 | 69.51 | 69.51 |
| Sum | 100 | 100 | 100 | 100 | 100 | 100 | 100 | 100 | 100 | 100 | 100 | 100 |

Measurement of Photo Characteristics of Organic Insulating Film

The organic insulating film was fabricated using the organic insulating film composition fabricated according to the embodiments 1 to 12. More specifically, the organic insulating film composition was spin-coated on a silicon wafer of 3 inches at 300 rpm for 20 seconds. Thereafter, the results were subject to soft baking at 110° C. for 120 seconds and were exposed to light of 50 mJ/cm$^2$ and 100 mJ/cm$^2$ respectively. The results were developed using a developer of TMAH 2.38 wt % for 70 seconds and rinsed using DI water for 50 seconds. Finally, the results were fully hardened by thermal processing at 230° C. for 30 minutes.

A thickness after spin coating, a thickness after development, a thickness after full hardening, and the remaining film ratio in the photo pattern of the organic insulating film fabricated using the compositions of the embodiments 1 and 7 in the organic insulating films fabricated as described above were measured and listed in Table 2. In Table 2, the remaining film ratio is a ratio of a thickness after full hardening to a thickness after spin coating.

TABLE 2

|  | EMBODIMENT 1 | EMBODIMENT 7 |
|---|---|---|
| Thickness (μm) after spin coating | 2.21 | 2.08 |
| Thickness (μm) after development | 2.14 | 1.92 |
| Thickness (μm) after full hardening | 1.91 | 1.64 |
| Remaining film ratio (%) | 86.43 | 78.85 |

Referring to Table 2, it was found that the photo pattern of the organic insulating film fabricated according to the embodiment 1 had the remaining film ratio of 86.43% after full hardening and the photo pattern of the organic insulating film fabricated according to the embodiment 7 had the remaining film ratio of 78.85% after full hardening. It was found that the photo patterns of the organic insulating films fabricated according to the embodiments 1 and 7 were excellent.

Furthermore, the photo patterns of the organic insulating films fabricated by exposing light of 50 mJ/cm$^2$ and 100 mJ/cm$^2$ were monitored. For example, the photo pattern of the organic insulating film fabricated according to the embodiment 1 was illustrated in FIG. 3A, the photo pattern of the organic insulating film fabricated according to the embodiment 7 was illustrated in FIG. 3B, and the photo pattern of the organic insulating film fabricated according to the embodiment 10 was illustrated in FIG. 3C.

Figure 3A:
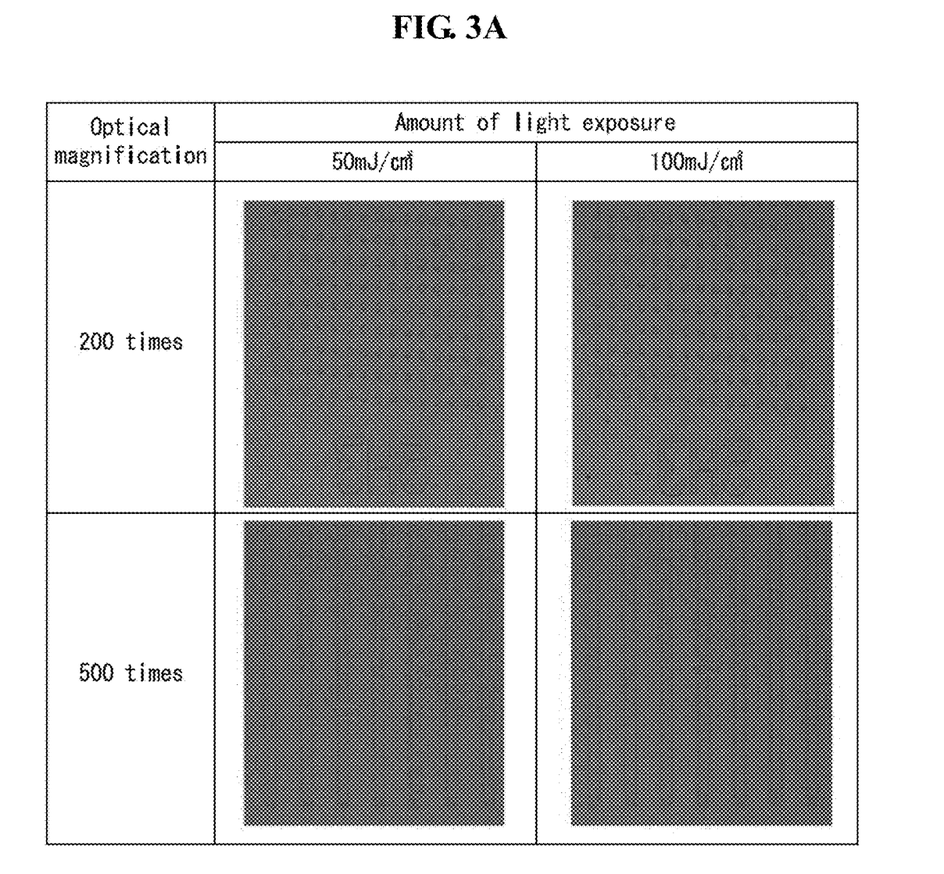
FIG. 3A is a photograph illustrating the photo patterns of an organic insulating film fabricated in accordance with an embodiment 1 of the present invention.
Figure 3B:
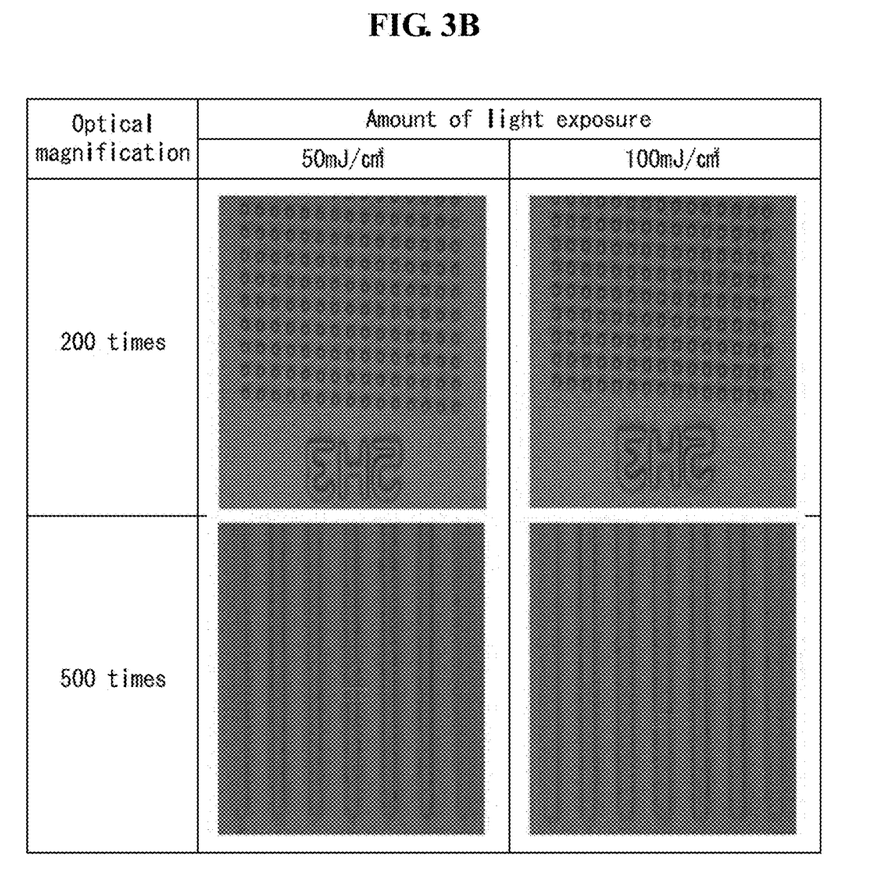
FIG. 3B is a photograph illustrating the photo patterns of an organic insulating film fabricated in accordance with an embodiment 7 of the present invention.
Figure 3C:
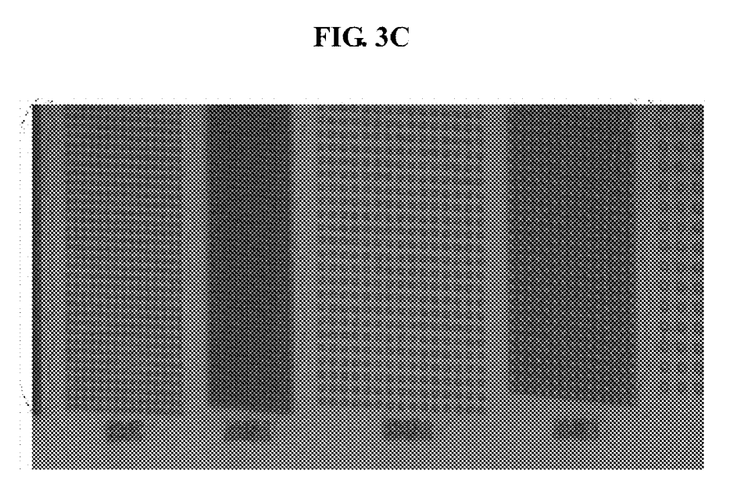
FIG. 3C is a photograph illustrating the photo patterns of an organic insulating film fabricated in accordance with an embodiment 10 of the present invention.

Referring to FIG. 3A, a photo pattern was not formed in the photo patterns of the organic insulating films fabricated according to the embodiments 1 to 6 in which the content of CEMA was 18.98 parts by weight or more. In contrast, referring to FIG. 3B, in the photo patterns of the organic insulating films fabricated according to the embodiments 7 to 12 in which the content of CEMA was 11.3 parts by weight or less, the photo patterns were excellently formed and sensitivity was excellent even in small light of 50 mJ/cm$^2$. Referring to FIG. 3C, in the case of the photo pattern of the organic insulating film fabricated according to the embodiment 10, the formation of the photo pattern was excellent, but a tearing phenomenon was generated in some coating surfaces after development.

Furthermore, after scratches were generated in the organic insulating film fabricated according to the embodiment 7, light having a wavelength equal to or more than 280 nm was radiated to part of the organic insulating film for 5 minutes and was not radiated to part of the organic insulating film. Furthermore, the scratches of the organic insulating film were monitored using an optical camera and illustrated in FIG. 4A. The scratches were monitored using an SEM and is illustrated in FIG. 4B. The scratches of the region to which light was not radiated were magnified and is illustrated in FIG. 4C, and the scratches of the region to which light was radiated were magnified and is illustrated in FIG. 4D.

Figure 4A:
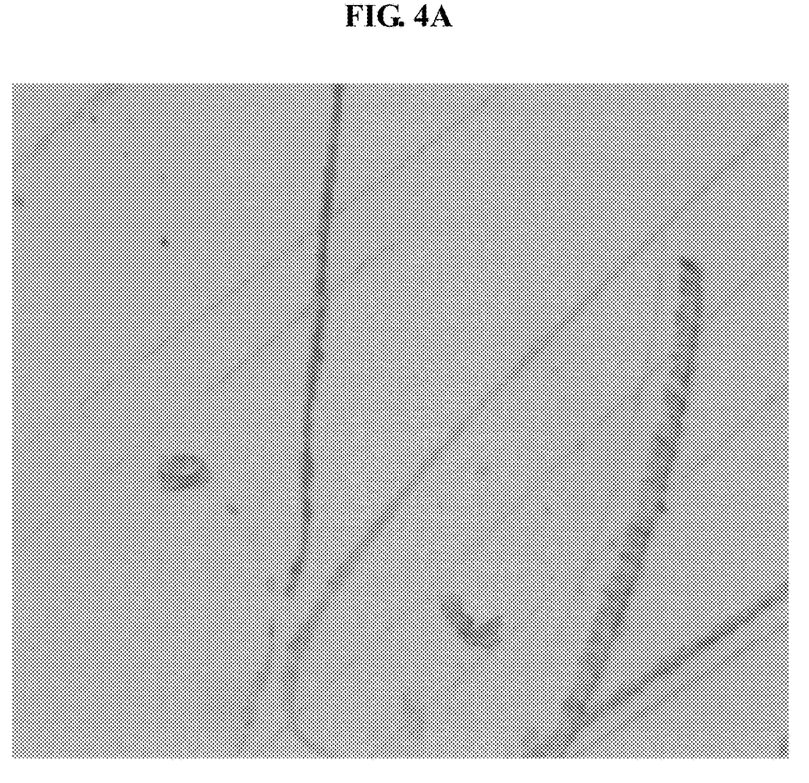
FIG. 4A is a photograph illustrating the scratches of the organic insulating film fabricated in accordance with the embodiment 7 of the present invention.
Figure 4B:
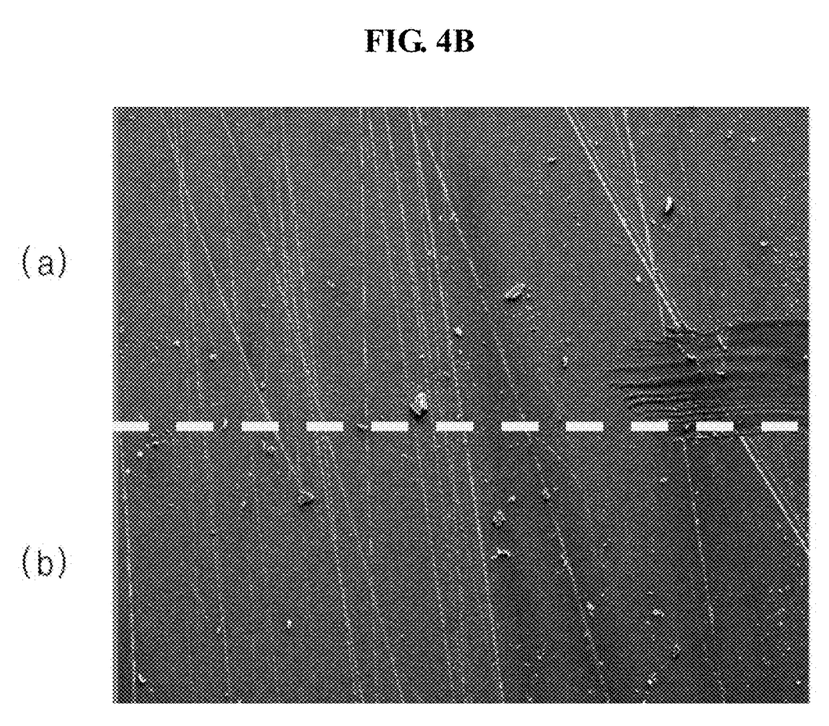
FIG. 4B is a SEM photograph of the organic insulating film fabricated in accordance with the embodiment 7 of the present invention.
Figure 4C:
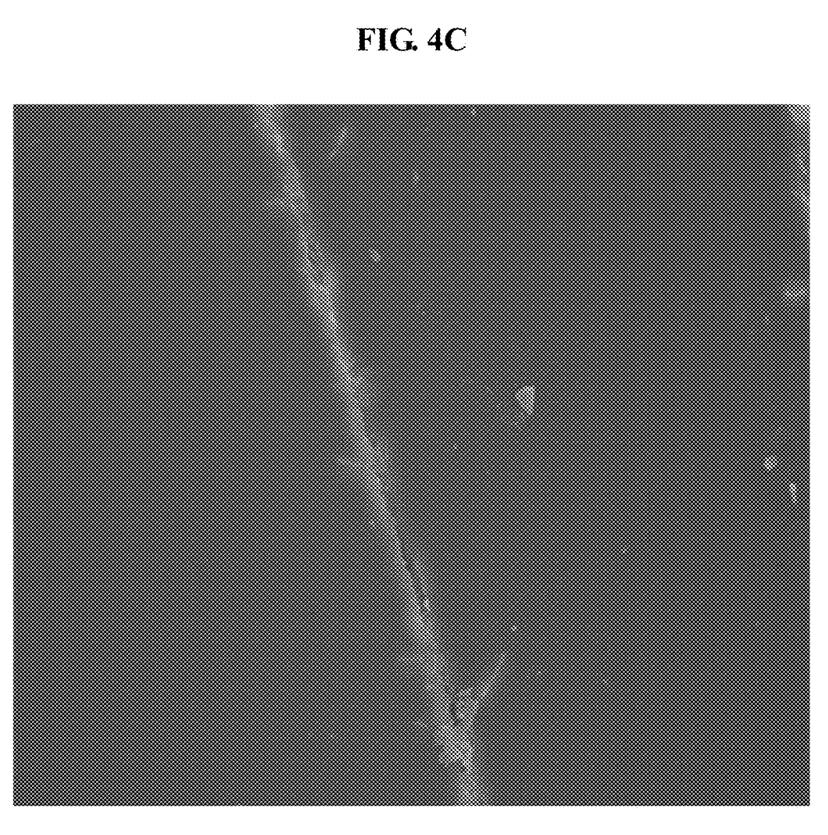
FIG. 4C is a photograph illustrating the enlarged portion of a scratch of a region to which light was not radiated.
Figure 4D:
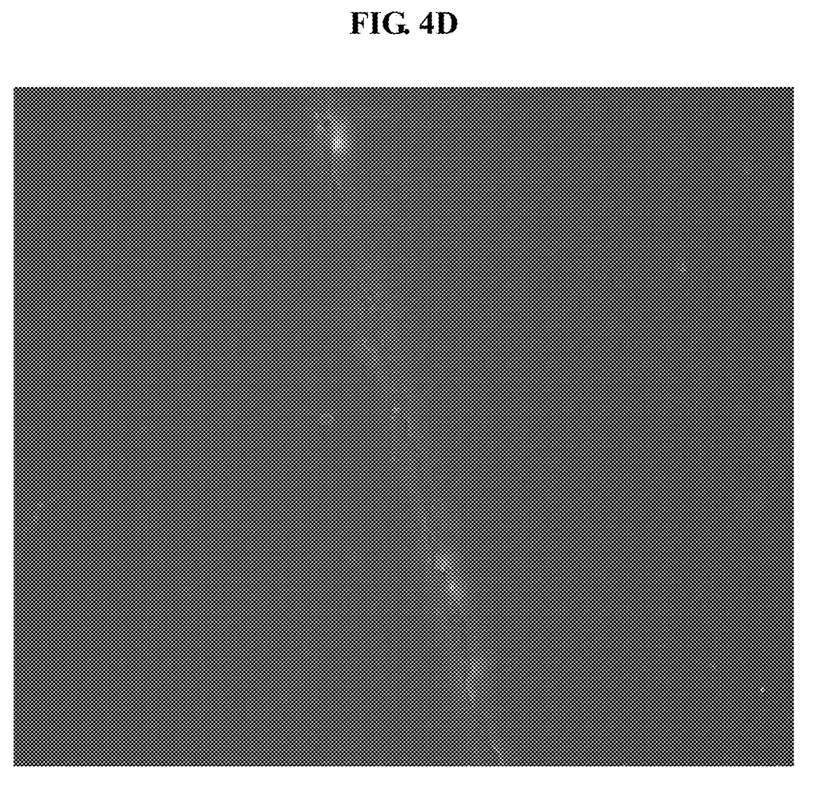
FIG. 4D is a photograph illustrating the enlarged portion of a scratch of a region to which light was radiated.

From FIG. 4A, it may be seen that scratches were generated in the organic insulating film. From FIG. 4B, it may be seen that scratches were generated in both the region (a) to which light was not radiated and the region (b) to which light was radiated. From FIGS. 4C and 4D, it may be seen that scratches were present in the organic insulating film of the region to which light was not radiated, but most of scratches disappeared from the organic insulating film of the region to which light was radiated. That is, it was proved that scratches generated in the organic insulating film composition including the monomer having cinnamoyl moiety were healed after light was radiated.

Experiment 3: Commerciality, Hardening Property, Pencil Hardness Measurement, and Self-Healing Proof of Organic Insulating Film Composition Fabrication of Organic Insulating Film Composition An organic insulating material sample 1 and sample 2 were fabricated by synthesizing GMA and CEMA at a ratio of 5 and 5. The characteristics of the sample 1 and the sample 2 were listed in Table 3 below.

TABLE 3

|  | SAMPLE 1 | SAMPLE 2 |
|---|---|---|
| Molecular weight (Mw) | 8100 | 19000 |
| Viscosity (cp) | 7000 | 10900 |
| Mole number (NV(%)) | 30 | 30 |

<Embodiment 13>

After an organic insulating material including 3.13 parts by weight of the monomer having cinnamoyl moiety of the sample 1 and 3 parts by weight of the photoinitiator in 93.87 parts by weight of a mixed solution of acrylic monomer benzyl acrylic acid (BAA), methyl methacylate (MM), and glycidyl methacylate (GMA), the photoinitiator (1-hydroxycyclohexyl)phenylmethanone, and the solvent propylene glycol monomethyl ether acetate (PGMEA) was fabricated, an organic insulating film composition was fabricated.

<Embodiment 14>

Under the same process conditions as the embodiment 13, an organic insulating film composition was fabricated in the same way, except that using 72.75 parts by weight of the mixed solution and 21.25 parts by weight of the monomer having cinnamoyl moiety of the sample 1.

<Embodiment 15>

Under the same process conditions as the embodiment 13, an organic insulating film composition was fabricated in the same way, except that using 58.2 parts by weight of the mixed solution and 38.8 parts by weight of the monomer having cinnamoyl moiety of the sample 1.

<Embodiment 16>

Under the same process conditions as the embodiment 13, an organic insulating film composition was fabricated in the same way, except that using 3.13 parts by weight of the monomer having cinnamoyl moiety of the sample 2.

<Embodiment 17>

Under the same process conditions as the embodiment 14, an organic insulating film composition was fabricated in the same way, except that using 24.25 parts by weight of the monomer having cinnamoyl moiety of the sample 2.

<Embodiment 18>

Under the same process conditions as the embodiment 15, an organic insulating film composition was fabricated in the same way, except that using 38.8 parts by weight of the monomer having cinnamoyl moiety of the sample 2.

Figure 5:
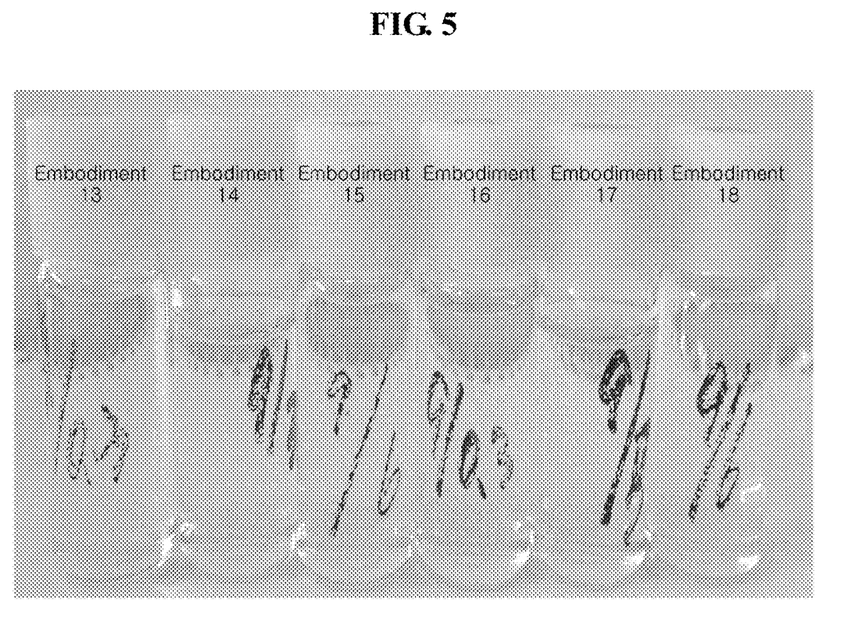
FIG. 5 is a photograph illustrating organic insulating film compositions fabricated in accordance with embodiments 13 to 18 of the present invention.

The organic insulating film compositions fabricated according to the embodiments 13 to 18 were illustrated in FIG. 5 and coated on the respective substrates. The commerciality, UV hardening property, and pencil hardness of the organic insulating film compositions were measured and illustrated in Table 4.

TABLE 4

|  | #13 | #14 | #15 | #16 | #17 | #18 |
|---|---|---|---|---|---|---|
| Commerciality | OK | OK | OK | OK | OK | OK |
| UV hardening property | OK | OK | OK | OK | OK | OK |
| Pencil hardness | H | H | H | H | H | H |

Referring to Table 4, it was found that although the molecular weight and viscosity of the monomer having cinnamoyl moiety had the conditions of Table 3, there was no problem in the commerciality and UV hardening property of the organic insulating films fabricated using the monomer having cinnamoyl moietys and the organic insulating films could be used as organic insulating films having pencil hardness of H.

Furthermore, after an organic insulating film composition of a comparative example in which the monomer having cinnamoyl moiety of the sample 2 was not mixed in the embodiment 18 was fabricated as a comparative example, the organic insulating film composition was coated on a substrate and an organic insulating film was fabricated.

After scratches were generated in the organic insulating films fabricated using the organic compositions according to the comparative example and the embodiment 18, light having a wavelength equal to or more than 280 nm was radiated to part of the organic insulating film for 5 minutes, and light was not radiated to part of the organic insulating film. Furthermore, the scratches in the organic insulating film of the comparative example were monitored using an optical camera and is illustrated in FIG. 6A, and the scratches in the organic insulating film of the embodiment 18 were monitored using an optical camera and illustrated in FIG. 6B.

Figure 6A:
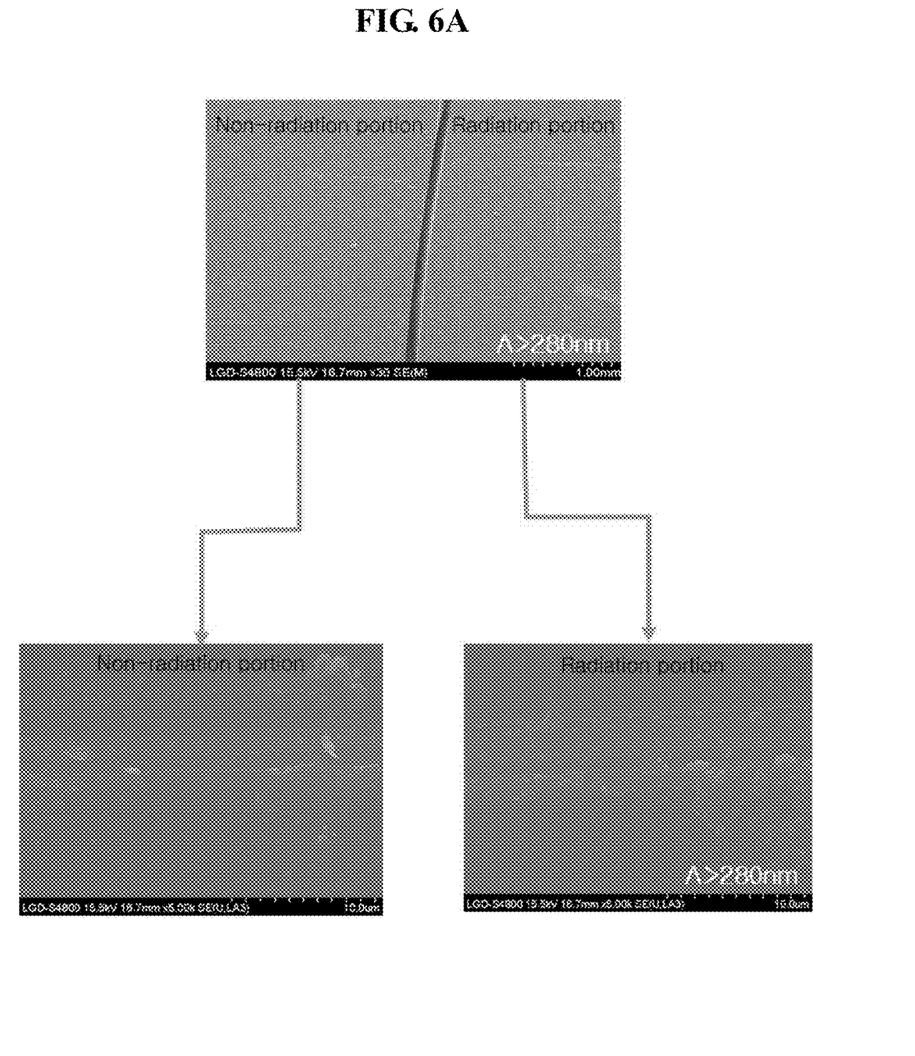
FIG. 6A is a photograph illustrating a scratch of the organic insulating film according to a comparative example of the present invention monitored by an optical camera.
Figure 6B:
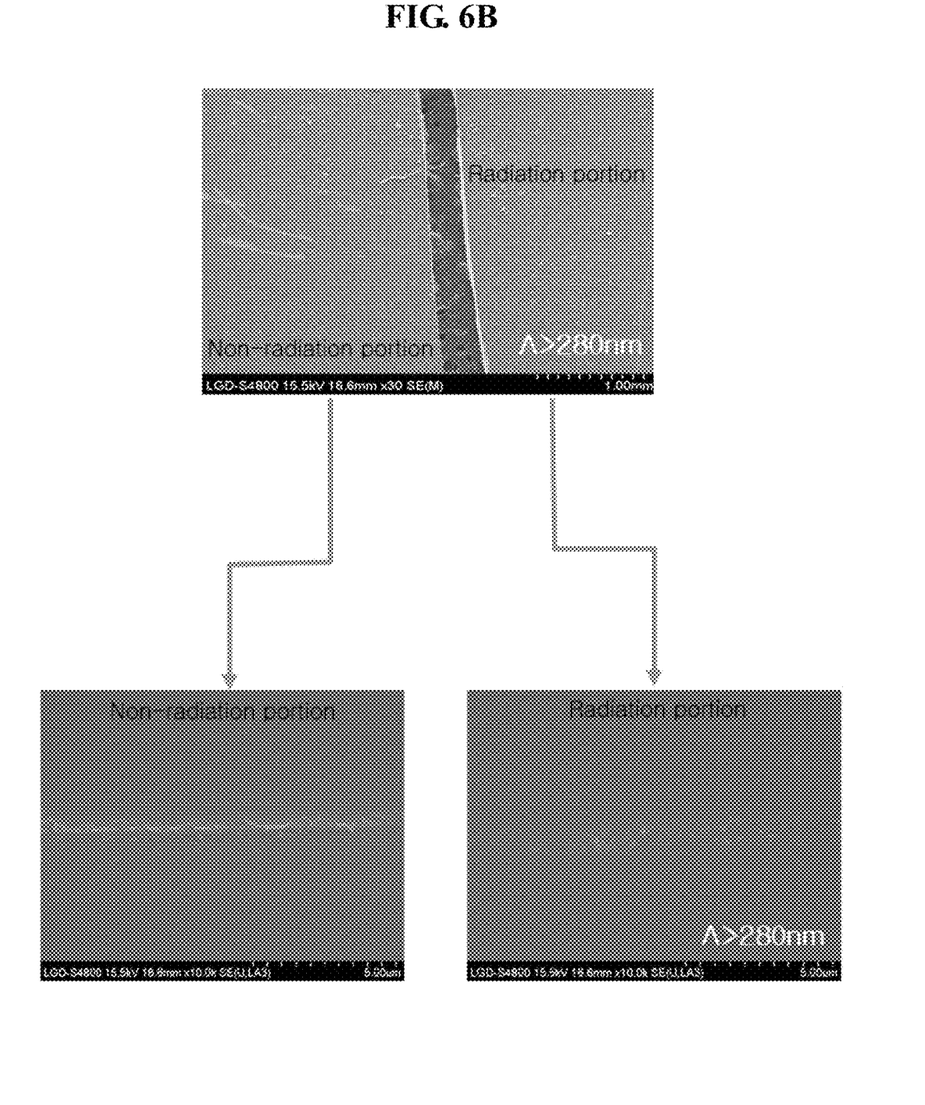
FIG. 6B is a photograph illustrating a scratch of the organic insulating film in accordance with an embodiment 18 of the present invention monitored using an optical camera.

From FIG. 6A, it was found that in the organic insulating film of the comparative example not including a monomer having cinnamoyl moiety, the scratches were more grown in the radiation portion to which light was radiated than in the radiation portion to which light was not radiated. In contrast, from FIG. 6B, it was found that in the organic insulating film of the embodiment 18 including the monomer having cinnamoyl moiety, the scratches in the radiation portion to which light was radiated become more unclear than those in the radiation portion to which light was not radiated. That is, it may be seen that the scratches in the organic insulating film of the embodiment 18 had been self-healed by the radiation of light.

In accordance with the aforementioned experiments, the organic insulating film including the new organic insulating material according to an embodiment of the present invention has an excellent commerciality, hardening property, pencil hardness, pattern property, and self-healing ability. Accordingly, the present invention has an advantage in that a crack in the organic insulating film can be self-healed by applying the organic insulating film to a flexible display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible display device, comprising:
a substrate;
a thin film transistor on the substrate;
an organic insulating film on the thin film transistor; and
a pixel electrode on the organic insulating film,
wherein the organic insulating film comprises an organic insulating material including an acrylic polymer wherein the acrylic polymer comprises a monomer having cinnamoyl moiety and two or more acrylic monomers selected from BAA (Benzyl acrylic acid), MMA (Methyl methacrylate), and GMA (Glycidyl methacrylate),
wherein the monomer having cinnamoyl moiety is represented by Chemical Formula 1 below,

[Chemical Formula 1]

Cinnamoyloxy Ethyl Methacrylate (CEMA)

2. The flexible display device of claim 1, wherein the substrate is transmissive to light having a wavelength equal to or more than 280 nm.

3. The flexible display device of claim 1, wherein:
the flexible display device comprises an organic light emitting display comprising a bank layer, an organic light-emitting layer, and a counter electrode on the pixel electrode, and
the bank layer is made of a same substance as the organic insulating film.

4. The flexible display device of claim 1, wherein the organic insulating film is a positive type or a negative type photosensitive organic insulating film.

5. A display device comprising:
a flexible substrate; and
a matrix of electroluminescent pixels on the flexible substrate, each pixel having at least one thin film transistor, an organic insulating film on the thin film transistor, and a pixel electrode on the organic insulating film,
wherein the organic insulating film is configured to have improved light transmittance, to have less volume reduction and to be less prone to cracks or deformities caused by bending of the flexible substrate, when compared to a conventional photosensitive resin that has been subject to a hardening process wherein the organic insulating film comprises an organic insulating material including an acrylic polymer having cinnamoyl moiety,
wherein the acrylic polymer is comprised of a monomer having cinnamoyl moiety and two or more acrylic monomers selected from BAA (Benzyl acrylic acid), MMA (Methyl methacrylate), and GMA (Glycidyl methacrylate), whereby the monomer having cinnamoyl moiety exhibits crack healing properties with respect to cracks caused by bending of the flexible substrate,
wherein the monomer having cinnamoyl moiety is represented by Chemical Formula 1 below Cinnamoyloxy Ethyl Methacrylate (CEMA)

* * * * *